United States Patent [19]
Cliff et al.

[11] Patent Number: 5,909,126
[45] Date of Patent: *Jun. 1, 1999

[54] PROGRAMMABLE LOGIC ARRAY INTEGRATED CIRCUIT DEVICES WITH INTERLEAVED LOGIC ARRAY BLOCKS

[75] Inventors: Richard G. Cliff, Milpitas; Francis B. Heile, Santa Clara; Joseph Huang, San Jose; Christopher F. Lane, Campbell; Fung Fung Lee, Milpitas; Cameron McClintock, Mountain View; David W. Mendel, Sunnyvale; Ninh D. Ngo; Bruce B. Pedersen, both of San Jose; Srinivas T. Reddy, Fremont; Chiakang Sung, Milpitas; Kerry Veenstra, San Jose; Bonnie I. Wang, Cupertino, all of Calif.

[73] Assignee: Altera Corporation, San Jose, Calif.

[21] Appl. No.: 08/672,676

[22] Filed: Jun. 28, 1996

Related U.S. Application Data

[63] Continuation-in-part of application No. 08/442,832, May 17, 1995, Pat. No. 5,543,732, and a continuation-in-part of application No. 08/442,802, May 17, 1995, Pat. No. 5,541,530
[60] Provisional application No. 60/015,267, Apr. 11, 1996.

[51] Int. Cl.[6] .................................. H03K 19/177
[52] U.S. Cl. ................................. 326/41; 326/39
[58] Field of Search .......................... 326/39–41

[56] References Cited

U.S. PATENT DOCUMENTS

| Re. 34,363 | 8/1993 | Freeman | 307/465 |
|---|---|---|---|
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |

(List continued on next page.)

FOREIGN PATENT DOCUMENTS

| 454352 A1 | 4/1991 | European Pat. Off. | H03K 19/177 |
|---|---|---|---|
| 463746 A2 | 1/1992 | European Pat. Off. | G06F 15/60 |
| 630115 A2 | 12/1994 | European Pat. Off. | H03K 19/177 |
| 746105 A2 | 12/1996 | European Pat. Off. | |
| 2300950 | 11/1996 | United Kingdom . | |
| 2311885 | 10/1997 | United Kingdom . | |
| WO 95/04404 | 2/1995 | WIPO | H03K 19/177 |
| WO 95/22205 | 8/1995 | WIPO | H03K 19/177 |
| 95/30952 | 11/1995 | WIPO . | |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

(List continued on next page.)

*Primary Examiner*—Jon Santamauro
*Attorney, Agent, or Firm*—Fish & Neave; Robert R. Jackson; Douglas A. Cardwell

[57] ABSTRACT

A programmable logic array integrated circuit device includes a plurality of regions of programmable logic disposed on the device in a two-dimensional array of intersecting rows and columns of such regions. Each row has a plurality of adjacent horizontal conductors, and each column has a plurality of adjacent vertical conductors. The regions in a row are interspersed with groups of local conductors which interconnect the adjacent regions and the associated horizontal and vertical conductors. The local conductors can also be used for intra-region communication, as well as communication between adjacent regions. Secondary signals such as clocks and clears for the regions can be drawn either from dedicated secondary signal conductors or normal region inputs. Memory cell requirements for region input signal selection are reduced by various techniques for sharing these memory cells.

43 Claims, 7 Drawing Sheets

U.S. PATENT DOCUMENTS

| | | |
|---|---|---|
| 4,871,930 | 10/1989 | Wong et al. .............................. 307/465 |
| 4,899,067 | 2/1990 | So et al. |
| 4,912,342 | 3/1990 | Wong et al. .............................. 307/465 |
| 5,023,606 | 6/1991 | Kaplinsky ............................. 340/825.8 |
| 5,073,729 | 12/1991 | Greene et al. ......................... 307/465.1 |
| 5,121,006 | 6/1992 | Pedersen ................................. 307/465 |
| 5,122,685 | 6/1992 | Chan et al. ........................... 307/465.1 |
| 5,132,571 | 7/1992 | McCollum et al. .................. 307/465.1 |
| 5,144,166 | 9/1992 | Camarota et al. .................... 307/465.1 |
| 5,208,491 | 5/1993 | Ebeling et al. .......................... 307/465 |
| 5,212,652 | 5/1993 | Agrawal et al. ........................... 326/41 |
| 5,218,240 | 6/1993 | Camarota et al. ...................... 307/443 |
| 5,220,214 | 6/1993 | Pedersen ................................. 307/465 |
| 5,225,719 | 7/1993 | Agrawal et al. ........................ 307/465 |
| 5,255,203 | 10/1993 | Agrawal et al. ........................ 364/489 |
| 5,258,668 | 11/1993 | Cliff et al. ............................... 307/465 |
| 5,260,610 | 11/1993 | Pedersen et al. ........................ 307/465 |
| 5,260,611 | 11/1993 | Cliff et al. ............................... 307/465 |
| 5,274,581 | 12/1993 | Cliff et al. ............................... 364/784 |
| 5,338,984 | 8/1994 | Sutherland ............................ 307/465.1 |
| 5,350,954 | 9/1994 | Patel ........................................ 307/465 |
| 5,371,422 | 12/1994 | Patel et al. ................................. 326/41 |
| 5,381,058 | 1/1995 | Britton et al. ............................. 326/41 |
| 5,448,186 | 9/1995 | Kawata ...................................... 326/41 |
| 5,455,525 | 10/1995 | Ho et al. .................................... 326/41 |
| 5,467,029 | 11/1995 | Taffe et al. ................................ 326/41 |
| 5,469,003 | 11/1995 | Kean ......................................... 326/39 |
| 5,483,178 | 1/1996 | Costello et al. .......................... 326/41 |
| 5,509,128 | 4/1996 | Chan ........................................ 395/311 |
| 5,631,576 | 5/1997 | Lee et al. .................................. 326/41 |

OTHER PUBLICATIONS

*The Programmable Gate Array Data Book,* 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xilinx Inc., San Jose, CA, pp. 2–7, 2–12, and 2–13.

"XC5000 Logic Cell Array Family, Technical Data, Advance Information," Xilinx, Inc., Feb. 1995.

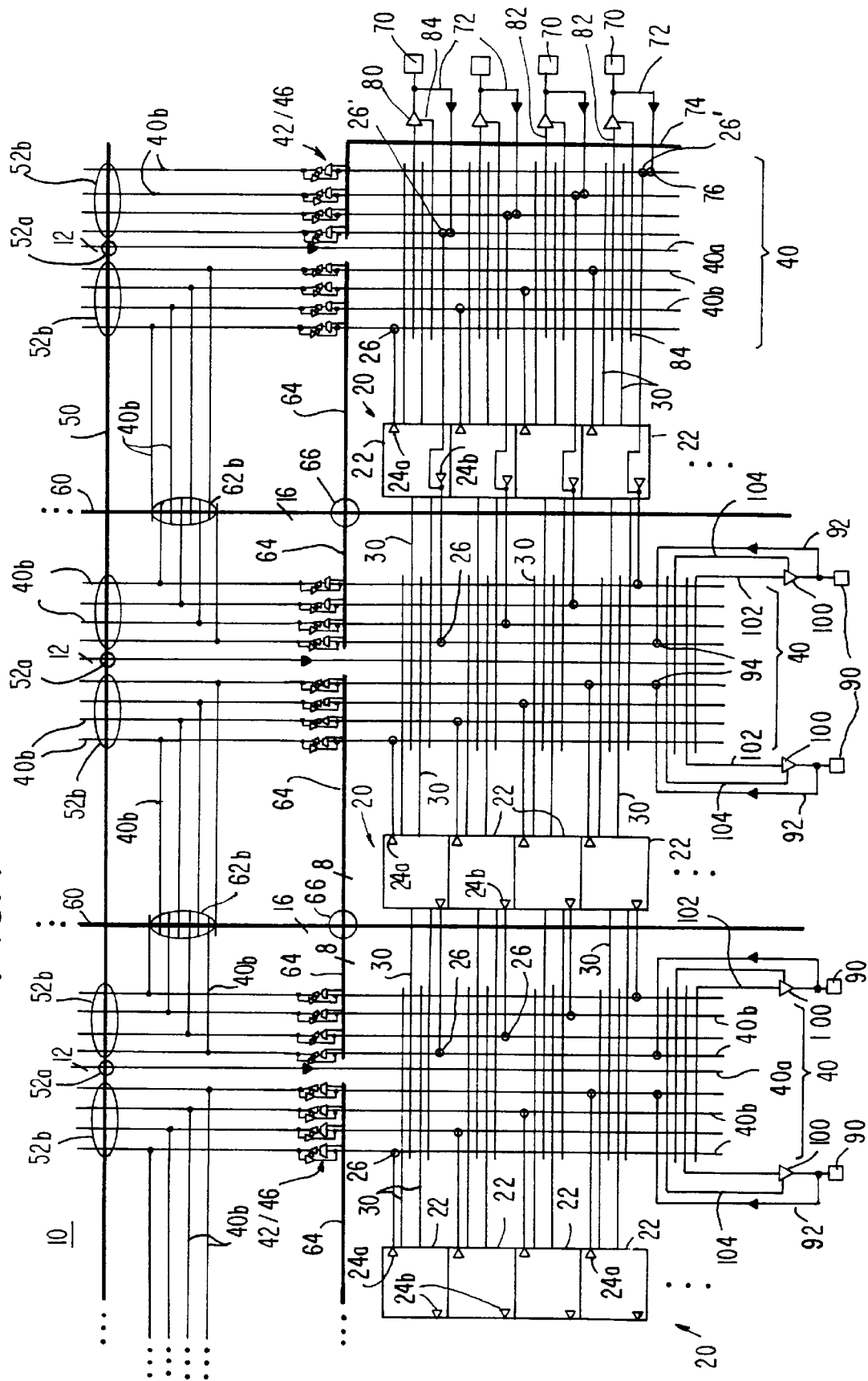
FIG. I

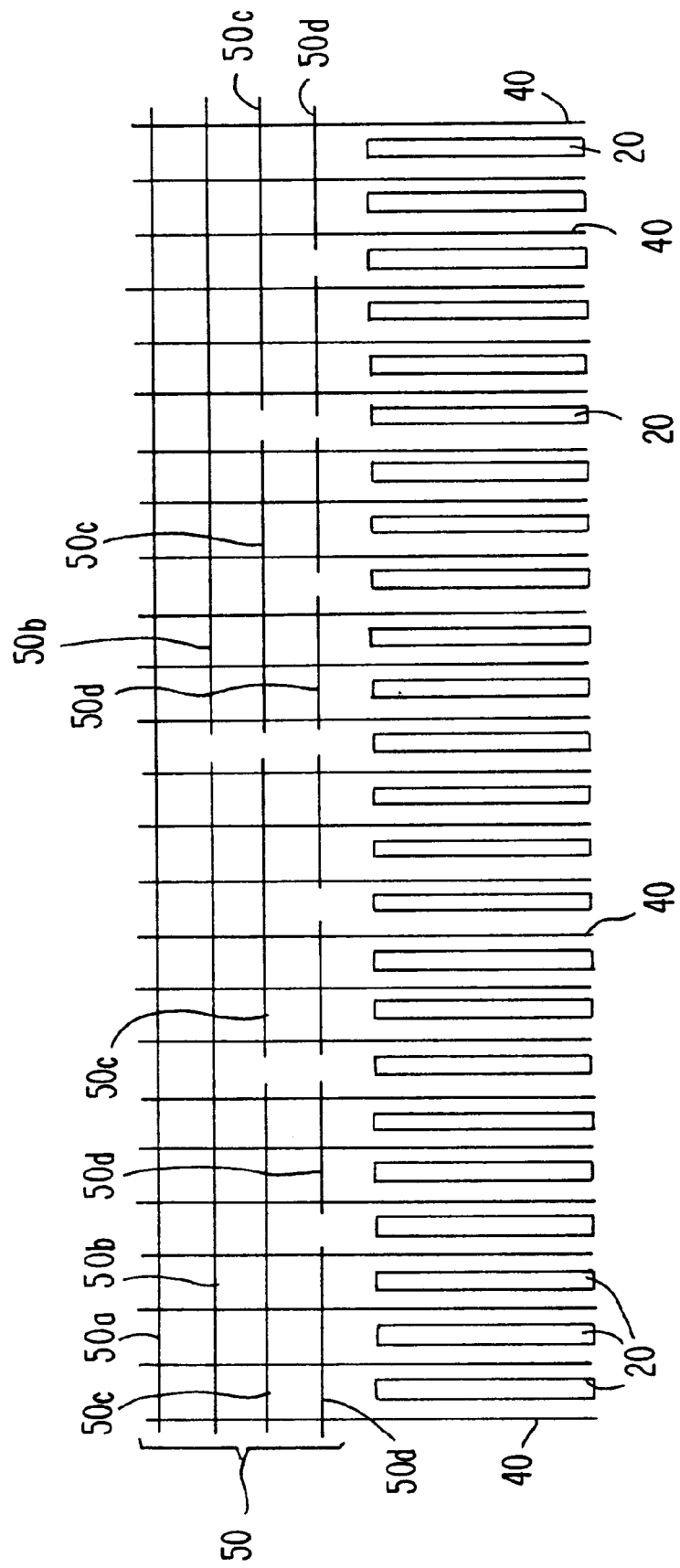

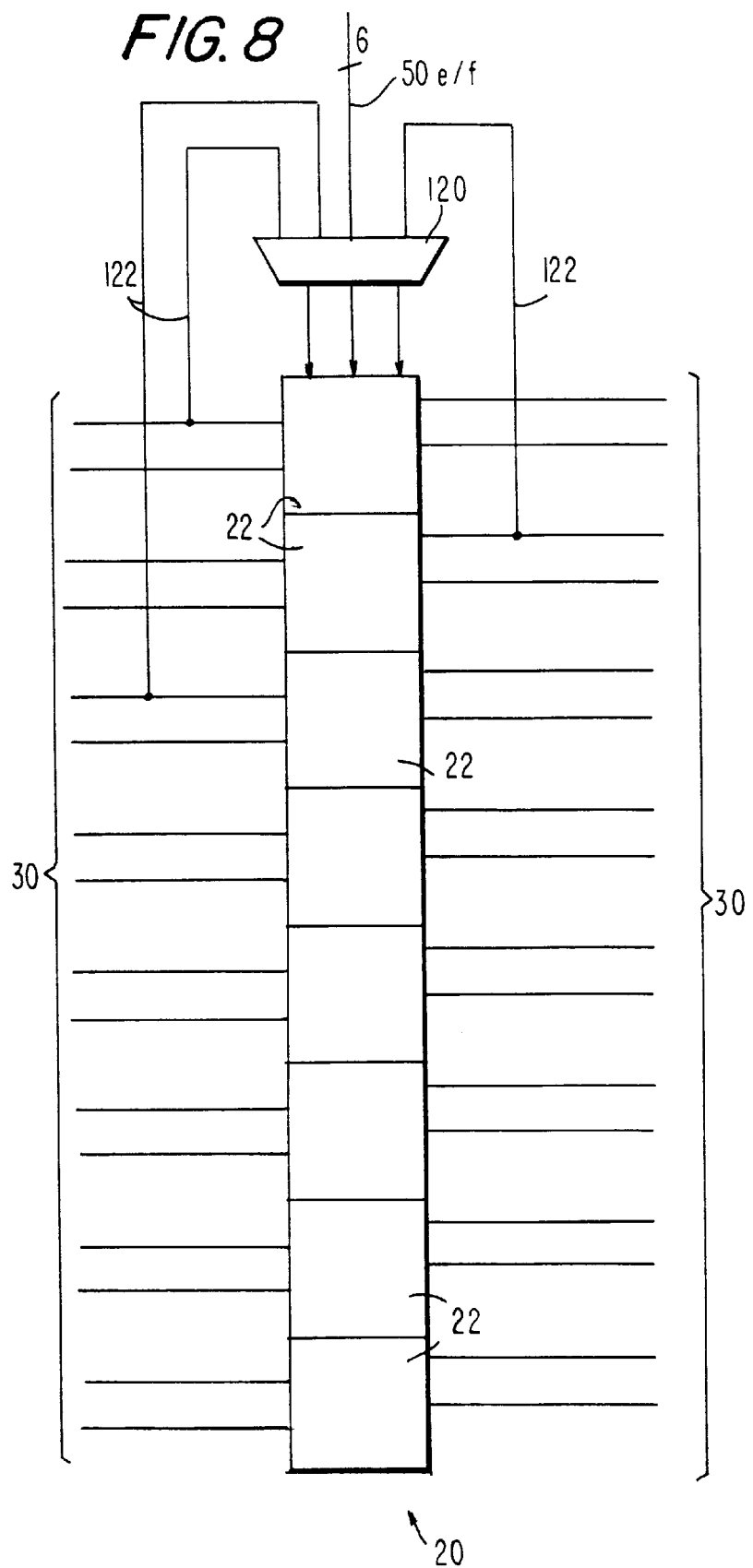

PROGRAMMABLE LOGIC ARRAY INTEGRATED CIRCUIT DEVICES WITH INTERLEAVED LOGIC ARRAY BLOCKS

CROSS REFERENCE TO RELATED APPLICATIONS

This application claims the benefit of U.S. provisional application Ser. No. 60/015,267, filed Apr. 11, 1996.

This is a continuation-in-part of U.S. application Ser. No. 08/442,832, filed May 17, 1995, now U.S. Pat. No. 5,543,732, and U.S. application Ser. No. 08/442,802, filed May 17, 1995, now U.S. Pat. No. 5,541,530, both of which are hereby incorporated by reference herein.

BACKGROUND OF THE INVENTION

This invention relates to programmable logic array integrated circuit devices, and more particularly to the interconnection resources that are provided in such devices.

Cliff et al. U.S. Pat. No. 5,689,195 shows programmable logic array integrated circuit devices of great power and flexibility. (The Cliff et al. '195 patent is hereby incorporated by reference herein.) There are many situations in which the full power and flexibility of these devices are needed. There are other situations, however, in which it would be desirable to economize somewhat on these devices. Research therefore continues into ways to provide nearly the capability of the above-mentioned devices, but to do so ore efficiently.

The interconnection resources in programmable logic devices are extremely important to the full usability of the logic on those devices. However, these interconnection resources consume a substantial fraction of the total resources of the device. More efficient interconnection resources can therefore contribute greatly to reducing the size and therefore the cost of programmable logic devices.

In view of the foregoing, it is an object of this invention to provide improved programmable logic array integrated circuit devices.

It is a more particular object of this invention to provide more efficient and economical interconnection resources for programmable logic array integrated circuit devices.

SUMMARY OF THE INVENTION

These and other objects of the invention are accomplished in accordance with the principles of the invention by providing programmable logic array integrated circuit devices having a plurality of regions of programmable logic disposed on the device in a two-dimensional array of intersecting rows and columns of such regions. (Each such row or column may be considered a linear array.) Each region has a plurality of inputs and is programmable to provide one or more outputs which are one or more logical functions of the inputs. For example, each region may include one or more logic modules, each of which has several inputs and is programmable to produce an output which is any of several logical functions of the inputs.

A plurality of "horizontal" inter-region interconnection conductors is associated with each row of regions for conveying signals along that row. A plurality of "vertical" inter-region interconnection conductors is associated with each column of regions for conveying signals along that column. A plurality of local conductors is associated with each of the regions for conveying signals into or out of the region and for conveying signals between various parts (e.g., logic modules) of the region. The local conductors associated with each region are programmably connectable to the inputs and outputs of that region. The local conductors associated with each region are also programmably connectable to the horizontal and vertical conductors adjacent to that region.

At least some of the local conductors associated with each region are preferably provided as two programmably connectable segments. A first of these segments includes programmable connections to adjacent horizontal and vertical conductors. The second segment includes programmable connections to inputs and at least one output of the associated region. Thus the first segment can be used by itself to connect horizontal and vertical conductors, while the second segment is being used for intra-region communication. Alternatively, the two segments can be connected to one another for use of the local conductor to convey a signal into or out of the region.

The association between local conductor groups and regions is preferably not one-for-one. Rather, each region is preferably disposed between two groups of local conductors, and each group of local conductors is preferably disposed between two regions. In other words, the regions and local conductors are interleaved or interdigitated. Each region can then get some of its inputs from the local conductors on each side of that region, and each region can apply its outputs to local conductors on both sides of that region. Correspondingly, each group of local conductors can convey signals to, from, or between logic regions on both sides of that group.

The features described in the two preceding paragraphs greatly enhance the usability of the local conductors. Segmenting them allows them to serve several different purposes. Interleaving them between logic regions allows them to be shared by two logic regions. Such sharing may allow the overall number of local conductors to be reduced, with no significant loss of routing flexibility. This arrangement of the local conductors between adjacent regions also allows communication between such regions without the need to employ more general interconnection resources (e.g., the above-mentioned horizontal conductors) to make these connections.

In the most preferred embodiments, the horizontal conductors associated with each row are provided in several (i.e., at least three) different lengths. Some of these conductors span all of the logic regions in the row. Horizontal conductors of a shorter second length span a second number of logic regions which is substantially less than all of the regions in the row. Horizontal conductors of a still shorter third length span a still smaller number of logic regions. For example, a row of logic regions may be subdivided by halves, quarters, and eighths, with some of the associated horizontal conductors spanning the entire row, some spanning each half of the row, some spanning each quarter of the row, and some spanning each eighth of the row. In this way, relatively short interconnections can often be made using only a relatively short interconnection conductor, thereby saving the longer conductors for longer interconnections. The principles summarized in this paragraph can alternatively or additionally be applied to the vertical conductors.

Because of the large number of regions and associated local conductors, it can be especially helpful to economize in the way in which the local conductors are programmably connectable to region inputs. In the especially preferred embodiments, the local conductor groups are subdivided into at least two main subgroups. These main subgroups are further subdivided into smaller secondary subgroups (e.g., of four local conductors each). Each of the main subgroups is traversed by the same number of intermediate conductors as there are local conductors in each secondary subgroup. Each local conductor in each secondary subgroup is programmably connectable to a respective one of the intermediate conductors that traverse that local conductor. All of these programmable connections for a given secondary subgroup are controlled in common by a common programmable element. Additional programmable elements select one of the intermediate conductors associated with each main subgroup as the one to provide an intermediate output signal for that main subgroup. Further programmably controlled selection circuitry selects two final output signals from the two intermediate output signals. These final output signals are used as logic region input signals. A structure of this kind can significantly reduce the required number of programmable control elements.

In addition to their primary inputs, which have been discussed above, the logic regions (or logic modules within logic regions) may require so-called secondary signals (e.g., for clocking registers in the regions, for clearing those registers, etc.). To reduce the amount of interconnection circuitry required to supply such secondary signals, while still maintaining considerable flexibility in the provision of those signals, each region may have associated secondary signal selection circuitry for selecting secondary signals either from dedicated secondary signal conductors that extend adjacent to each region or from normal inputs to the logic region. The normal inputs that are thus selectable to provide secondary signals may all be associated with one of the logic modules in the region, or these inputs may be spread out over several logic modules in the region. Secondary signal selections may be made for the region as a whole, or for predetermined groups of logic modules in the region. But to reduce resource consumption, these selections are preferably not made on an individual logic module basis Further features of the invention, its nature and various advantages will be more apparent from the accompanying drawings and the following detailed description of the preferred embodiments.

BRIEF DESCRIPTION OF THE DRAWINGS

FIG. 1 is a simplified schematic block diagram of a representative portion of an illustrative programmable logic array integrated circuit device constructed in accordance with this invention.

FIG. 4 is a simplified schematic block diagram showing an illustrative embodiment of another possible feature of circuitry of the type shown in FIG. 1 in accordance with this invention.

FIG. 6b is similar to FIG. 6a and shows an alternative embodiment of the circuitry shown in FIG. 6a.

FIG. 8 is a simplified schematic block diagram showing an alternative embodiment of a portion of what is shown in FIG. 5.

DETAILED DESCRIPTION OF THE PREFERRED EMBODIMENTS

Figure 7:
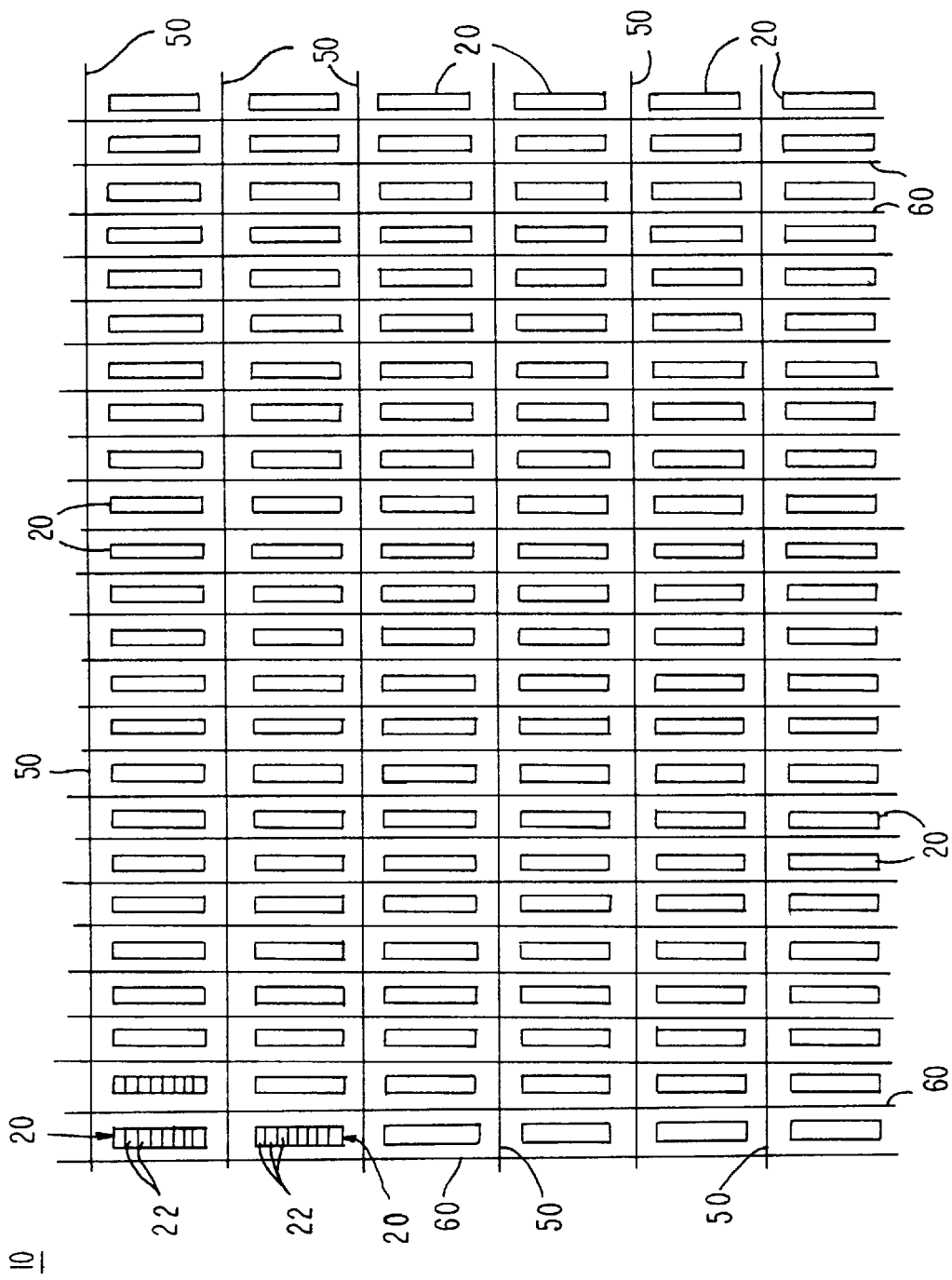
FIG. 7 is a simplified schematic block diagram of more of an illustrative device of which the circuitry shown in FIG. 1 or FIG. 5 may be a representative portion.

A representative portion of an illustrative programmable logic array integrated circuit device 10 constructed in accordance with this invention is shown in FIG. 1. The depicted portion is a lower right-hand corner of device 10, as the device is viewed in FIG. 1. A part of the lower-most row of logic array blocks ("LABs") 20 is shown. In particular, representative portions of each of three LABs 20 in this row are shown. Thus these three LABs 20 also form portions of the three right-most columns of LABs on the device. A typical device 10 may have six rows and 24 columns of LABs 20. For completeness, more of this illustrative structure 10 is shown in FIG. 7.

Each row of LABs 20 has a plurality of horizontal conductors 50 extending from column to column along that now. Each column of LABs 20 has a plurality of vertical conductors 60 extending from row to row along that column. A typical device 10 may have 96 horizontal conductor channels 50 associated with each row, and 16 vertical conductor channels 60 associated with each column.

Each LAB 20 includes eight logic modules 22, although only four representative logic modules are shown for each LAB in FIG. 1. Each logic module 22 has four primary inputs (conductors 30 in FIG. 1) and is programmable to produce any of several logic functions of the inputs. For example, each logic module 22 may include a four-input look-up table that is programmable to produce any logical combination of its four inputs. In addition, each logic module 22 may include a register for selectively registering the output of the look-up table. This construction of a logic module is only illustrative, and many other constructions are equally possible. For example, logic modules 22 can alternatively be logic for forming a sum of products (i.e., so-called P-term logic). Each logic module 22 may also have many other features, such as the ability to function as one element in an arithmetic carry chain with adjacent logic modules (see, for example, Cliff et al. U.S. Pat. No. 5,274, 581), or as one element in a cascade chain with adjacent logic modules (see, for example, Cliff et. al. U.S. Pat. No. 5,258,668). (The two patents mentioned in the preceding sentence are hereby incorporated by reference herein.) In any event, each logic module 22 preferably has two primary outputs 24a and 24b. One of these outputs 24 may be the "combinatorial" output of the logic module (e.g., the look-up table output or the sum of products output). The other output 24 may be the "registered" output of the logic module (i.e., the combinatorial output as registered by a flip-flop register in the logic module). Most preferably, either of these output signals can be used for either of the physical outputs 24a and 24b.

Each LAB 20 is served by a plurality of local conductors 40. These conductors are of two basic types 40a and 40b. Conductors 40a (of which there are 12 between each horizontally adjacent pair of LABs 20) are used for bringing signals from the horizontal conductors 50 associated with the row that includes those conductors 40a to the LABs served by those conductors 40a. Thus each conductor 40a has programmable connections (represented by the circles 52a in FIG. 1) to several of the associated horizontal conductors 50. The number of conductors 40a and the population density of the programmable connections 52a to conductors 50 are preferably such that the signal on each conductor 50 has several ways (via conductors 40a) to reach each LAB 20 in the row associated with that conductor 50. (For convenience herein, connections like 52a are frequently referred to herein as "programmable logic connectors" or "PLCs".)

Figure 2:
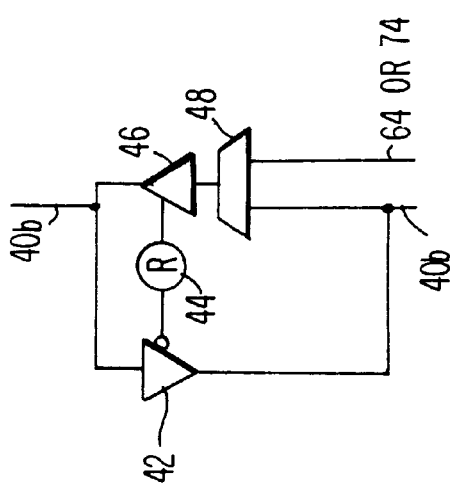
FIG. 2 is a more detailed, but still simplified, schematic block diagram of a representative portion of FIG. 1.

The other type of local conductors 40b (of which there are 16 (eight being shown) between each horizontally adjacent pair of LABs 20) have several different uses. For example, conductors 40b can be used to convey signals in either direction between the adjacent LABs 20 and either the adjacent horizontal conductors 50 or adjacent vertical conductors 60. Thus each of conductors 40b is programmably connectable to several of horizontal conductors 50 (by PLCs represented by ellipses 52b) and to several adjacent vertical conductors 60 (by PLCs represented by ellipses 62b). When a conductor 40b is driving from a horizontal or vertical conductor into the LAB area, an inbound tri-state driver 42 (see FIG. 2) in that conductor is enabled by an associated programmable function control element ("FCE") 44. Programming FCE 44 to enable driver 42 causes FCE 44 to disable an associated outbound tri-state driver 46. When a conductor 40b is driving from the LAB area to the horizontal or vertical conductors 50 or 60, the associated FCE 44 is programmed to enable the outbound driver 46 in that conductor 40b and to disable the associated inbound driver 42. The associated programmable logic connector ("PLC") 48 in that conductor 40b is also programmed to connect the lower part of that conductor to the upper part.

Another possible use of conductors 40b is to make interconnections between the logic modules 22 in the LABs 20 adjacent to those conductors. This requires only the lower part of a conductor 40b, and so the upper part of that same conductor can be simultaneously used (if desired) to connect an adjacent vertical conductor 60 to an adjacent horizontal conductor 50. For this purpose each PLC 48 has a second input 64. Each of inputs 64 is programmably connectable to any of several vertical conductors 60 by the PLCs represented by circles 66. Each PLC 48 can then be programmed to apply its input 64 to the associated outbound driver 46.

It will be noted that the structure of device 10 (in particular, bi-directional PLCs 62b and the branches of conductors 40b to those PLCs) allows signals to flow in either direction between vertical conductors 60 and adjacent LABs 20 without the need to use horizontal conductors 50 to make these connections.

Each output 24 of a logic module 22 is programmably connectable to one of the adjacent conductors 40b by the PLCs represented by the circles 26. Each logic module input conductor 30 is programmably connectable to any of the conductors 40 that it crosses.

It will be appreciated from FIG. 1 that each group of conductors 40 is between two horizontally adjacent LABs 20, and that each such group of conductors 40 can supply some of the inputs to and receive one of the outputs from each of the logic modules 22 in those two adjacent LABs. Similarly, each LAB 20 is between two horizontally adjacent groups of conductors 40, and the logic modules 22 in that LAB can receive inputs from both of those groups of conductors and can output to both of those groups. This distributes the inputs and outputs of a LAB over two adjacent groups of conductors 40, which increases signal routing flexibility in the device and/or may allow the number of conductors 40 to be decreased (as a result of more wide-spread sharing of the conductors 40 that are provided). For example, in fitting a user's logic design to device 10, so-called "fat LABs" (i.e., LABs 20 requiring large amounts of input resources such as conductors 40) can be interspersed in a row among so-called "thin LABs" (i.e., LABs 20 that require less input resources). It is not necessary to provide for every LAB 20 the large amount of conductors 40 required for the worst "fat LAB" case.

It will also be noted that the structure of device 10 allows much greater local distribution of the output(s) 24 of each logic module 22. In particular, without going beyond conductors 30 and the lower parts of conductors 40b, the output 24 of any logic module in a LAB can generally be applied as an input to any logic module in that LAB or the LABs to the left and right of that LAB. (Remember that the two outputs 24 of a logic module are preferably swappable for one another.) Thus, as a matter of purely local connections, each logic module output 24 can generally feed inputs of 24 nearby logic modules. There is no need to use any of the longer-distance interconnection resources 50 and 60 to make these connections.

The principle of adjacent LABs sharing local conductors is somewhat related to what is shown in Cliff et al. U.S. patent application Ser. No. 08/442,802, filed May 17, 1995, now U.S. Pat. No. 5,541,530, which is hereby incorporated by reference herein.

Along the left and right edges of device 10 input/output ("I/O") pins 70 effectively replace logic modules. Thus for each row of LABs 20 there are eight I/O pins 70 at each end of the row. I/O pins 70 are sometimes referred to as "horizontal" I/O pins because they are associated with rows of the device.

For use as an input pin, each I/O pin 70 has an input lead 72 which is connected to a vertical conductor 74 and which is also programmably connectable to one of the conductors 40b in the group of such conductors between the I/O pin and the first LAB 20 in the row that includes that I/O pin. The latter programmable connections (PLCs) are represented by circles 76. Conductors 74 are like above-described conductors 64, and thus in FIG. 2 the second input to each PLC 48 is designated "64 or 74". Conductors 74 can therefore be used to connect an associated horizontal I/O pin input to the upper portion of an associated conductor 40b. From there, the input signal can be distributed horizontally via one or more horizontal conductors 50. This routing of an input signal via a conductor 74 avoids having to use the lower part of a conductor 40b for this signal. Alternatively, however, a horizontal I/O pin input can be applied to the lower part of a conductor 40b. This allows very direct connection of this input to any of the logic modules 22 at the adjacent end of the associated row because each such logic module has two inputs 30 that are programmably connectable to any of the conductors 40b that can receive such I/O pin inputs. In addition, the lower part of each such conductor 40b is programmably connectable to the upper part of that conductor by circuitry of the type shown in FIG. 2 and described in detail above. Thus a horizontal I/O pin input can also get out by this routing for horizontal distribution on conductors 50.

With regard to the output operation of I/O pins 70, each such pin has an associated tri-statable output driver 80. Each driver 80 has a data input lead 82 that is programmably connectable to any of the conductors 40 between the associated I/O pin and the LAB 20 at the adjacent end of the associated row. Each driver 80 also has an output enable lead 84 that is programmably connectable to any of the same group of conductors 40. Thus each driver 80 can receive its data and output enable signals from any of the above-mentioned conductors 40. As previously described, the signals on these conductors 40 can come from associated horizontal conductors 50 (via PLCs 52), nearby vertical conductors 60 (via PLCs 62b), or the logic modules 22 in the LAB 20 at the adjacent end of the associated row (via PLCs 26). To increase output flexibility for the logic modules 22 at the end of the row, both of the outputs 24 of each such logic module are programmably connectable (via PLCs 26 and 26') to different ones of the conductors 40b between those logic modules and the adjacent I/O pins 70. This allows both of the outputs of these logic modules to be made available to the adjacent I/O pins 70, while either logic module output is also made available to go out of the logic module in the other direction.

At the top and bottom of each column there are two more I/O pins 90. I/O pins 90 are sometimes referred to as "vertical" I/O pins because they are associated with columns of the device. For input purposes, each I/O pin 90 has an input conductor 92 which is programmably connectable to one of the conductors 40b at the adjacent end of the associated column. PLCs 94 provide these connections. For output purposes, each I/O pin 90 has an associated tri-statable output driver 100. Each driver 100 has a data input lead 102 that is programmably connectable to any of the conductors 40 at the adjacent end of the associated column. Each driver 100 also has an output enable input lead 104 that is programmably connectable to any of that same group of conductors 40.

Figure 3:
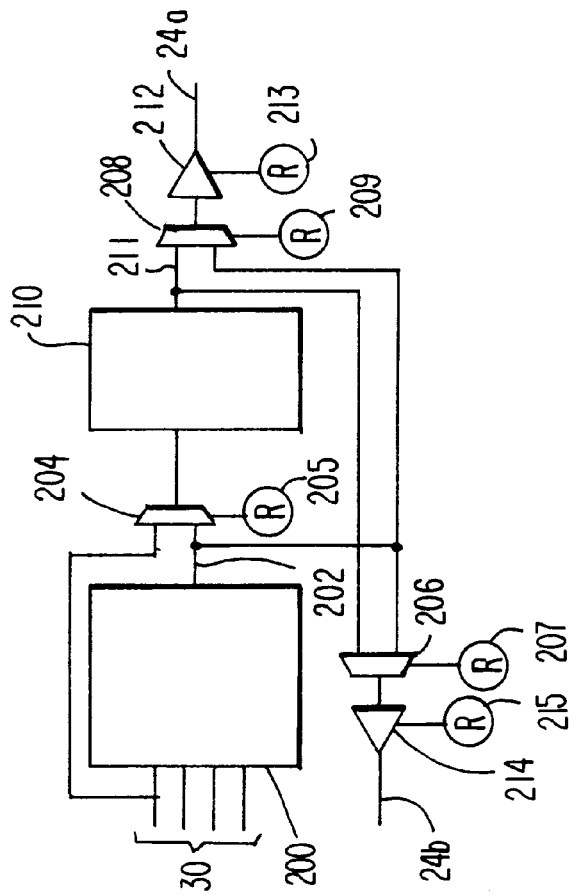
FIG. 3 is a more detailed, but still simplified, schematic block diagram of another representative portion of FIG. 1.

An illustrative embodiment of a representative logic module 22 is shown in more detail in FIG. 3. There it will be seen that in this embodiment each logic module includes a four-input look-up table 200. Look-up table 200 is programmable to produce an output signal 202 which is any logical combination of the four inputs 30 to the look-up table. Signal 202 is applied to one input terminal of each of three PLCs 204, 206, and 208. The other input to PLC 204 is one of the inputs 30 to look-up table 200, and the output from PLC 204 is the input to register 210. The output signal 211 of register 210 is the second input to each of PLCs 206 and 208. The output signal of PLC 208 is applied to tri-statable output driver 212. The output signal of PLC 206 is applied to tri-statable output driver 214. The output signals of drivers 212 and 214 are respectively the outputs 24a and 24b of the logic module. PLCs 204, 206, and 208 are respectively controlled by FCEs 205, 207, and 209. The output enable functions of drivers 212 and 214 are respectively controlled by FCEs 213 and 215.

From the foregoing it will be seen that either logic module output 24 can be either the combinatorial 202 or registered 211 signal produced by the logic module. Additionally, if register 210 is not needed to register the output signal 202 of the look-up table, then it can be used to register the input 30 that can bypass the look-up table via the second input to PLC 204.

FIG. 4 shows a preferred arrangement for the horizontal conductors 50 associated with each row in device 10. In this embodiment each group of conductors 50 includes 48 "global horizontal" or "GH" conductors 50a that extend along the entire length of the associated row of LABs 20. Each group of conductors 50 also includes two groups of 24 "half horizontal" or "HH" conductors 50b, each of which groups extends along a respective left or right half of the length of the associated row of LABs 20. Each group of conductors 50 further includes four groups of 12 "quarter horizontal" or "QH" conductors 50c, each of which groups extends along a respective one of four mutually exclusive quarters of the length of the associated row. Finally, each group of conductors 50 still further includes eight groups of 12 "eighth horizontal" or "EH" conductors 50d, each of which groups extends along a respective one of eight mutually exclusive eighths of the length of the associated row.

Each conductor 50a, 50b, and 50c has four programmable connections (PLCs) 52 to conductors within each group of conductors 40 that it extends adjacent to. Each conductor 50d has two programmable connections (PLCs) 52 to conductors within each group of conductors 40 that it extends adjacent to. Inputs from outside the row (i.e., from vertical conductors 60 or from I/O pins 70 and 90) can enter the row via GH conductors 50a or HH conductors 50b.

It will be understood that the principle of segmenting some horizontal conductor resource (i.e., by providing fractional length conductors such as the HH, QH, and EH conductors) can also be applied to vertical conductors 60. It will also be understood that the starting and ending points of the various fractional length conductors of a given length do not have to be all the same. For example, some of the approximately half-length conductors 50b could start and end adjacent columns other than those shown in FIG. 4 for the start and end of conductors 50b. The same is true for QH and EH conductors 50c and 50d.

The principle illustrated by FIG. 3 is somewhat related to what is shown in Cliff et al. U.S. patent application Ser. No. 08/442,832, filed May 17, 1995, now U.S. Pat. No. 5,543,732, which is hereby incorporated by reference herein.

Figure 5:
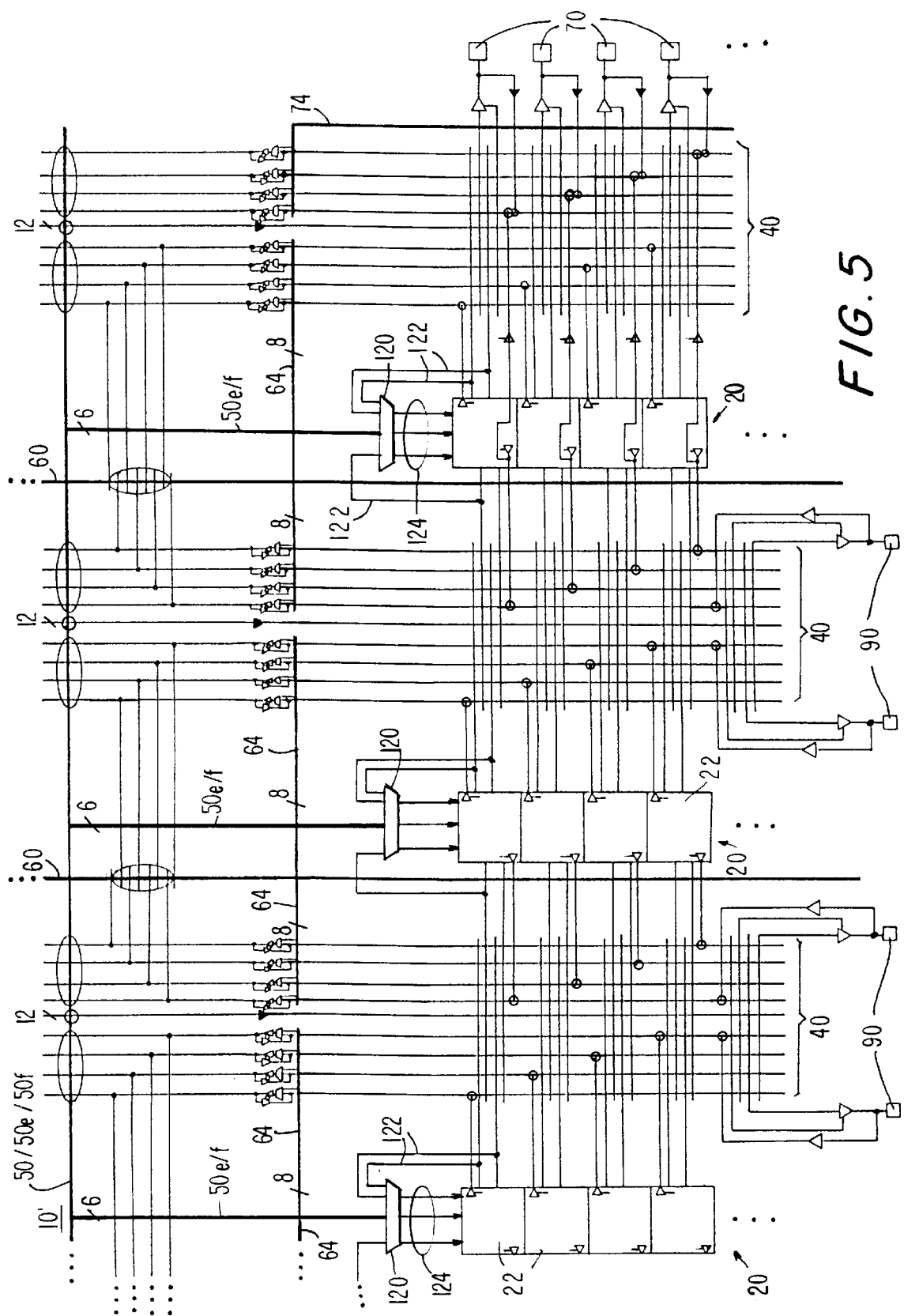
FIG. 5 is another diagram similar to FIG. 1 showing an illustrative embodiment of another feature of the invention.

FIG. 5 is generally similar to FIG. 1, but adds illustrative circuitry for providing so-called "secondary signals" to logic modules 22. These secondary signals may include clock ("CLK") signals for clocking the registers 210 in the logic modules, and/or clear ("CLR") signals for clearing those registers. In the embodiment 10' shown in FIG. 5 the conductors 50 for each row include four so-called "fast" conductors 50e and two clock signal conductors 50f. The network of conductors 50e and 50f preferably extends to adjacent each LAB 20 on device 10' with a minimum of switching (so as not to delay these signals). The signals on these conductors may originate at input pins of device 10', or they may originate at logic modules 22 on the device.

Adjacent each LAB 20, horizontally extending conductors 50e and 50f are tapped to extend into the LAB region as inputs to a PLC 120 associated with the LAB. Each PLC 120 also has several other inputs 122. These are inputs 30 to one of the logic modules 22 in the associated LAB 20. Each PLC 120 is programmable to select several of its input signals as secondary signals 124 (e.g., clock and clear signals) for the associated LAB.

If each PLC 120 outputs multiple secondary signals of a given kind (e.g., two clock signals or two clear signals), each logic module 22 in the associated LAB may include programmable switches for selecting which secondary signal that logic module will use. Alternatively, one of multiple similar secondary signals may always be used by certain ones of the logic modules in the associated LAB (e.g., the top four logic modules), while another of those signals is always used by others of those logic modules (e.g., the bottom four logic modules). This alternative reduces the amount of switching required in each logic module.

Using certain logic module inputs 30 to supply some of the inputs to each PLC 120 avoids the need for additional programmable connections in order to pick up these PLC 120 inputs from conductors 40. If a LAB 20 needs to derive so many of its secondary signals locally from inputs 30, it may be necessary to sacrifice or substantially sacrifice the logic module 22 whose inputs 30 have been taken over for this purpose. However, this is a relatively rare requirement. In the particular embodiment shown in FIG. 5, the top logic module 22 in each LAB supplies the inputs 122 to the associated PLC 120. Alternatively, each input 122 could be supplied by a different logic module 22 to reduce the risk that a logic module will have to be substantially sacrificed as mentioned above. FIG. 8 shows an example of this type structure. Even with the embodiment shown in FIG. 5, the register of the top logic module 22 can still be used if the logic module input 30 which can be registered separately as shown in FIG. 3 is not connected to one of inputs 122.

Figure 6A:
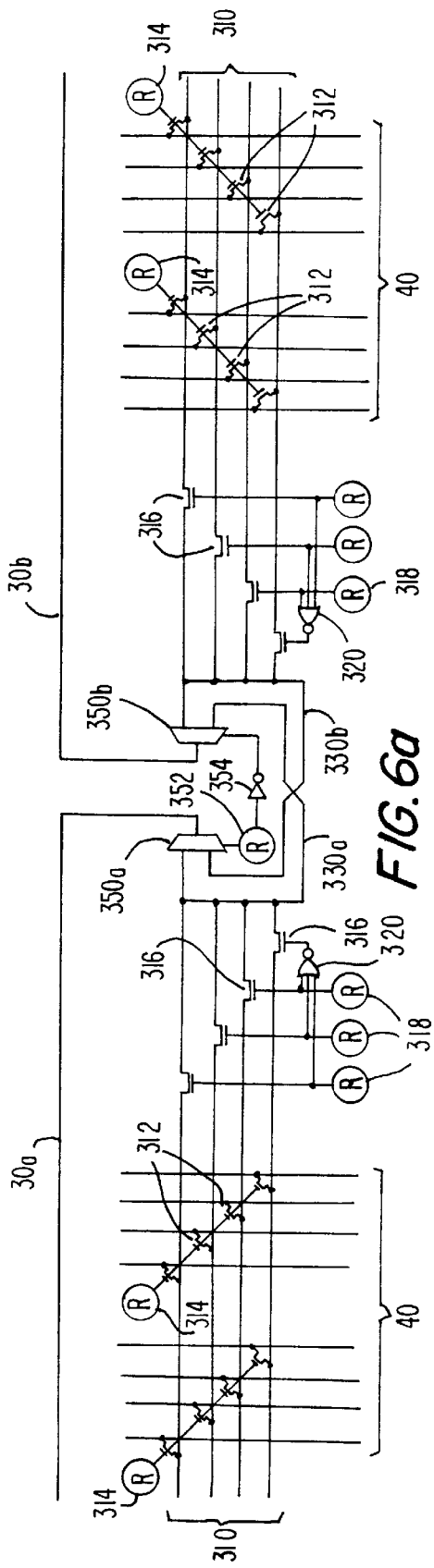
FIG. 6a is a simplified schematic block diagram showing an illustrative embodiment of still another possible feature of circuitry of the type shown in FIGS. 1 and 5 in accordance with this invention.
Figure 6B:
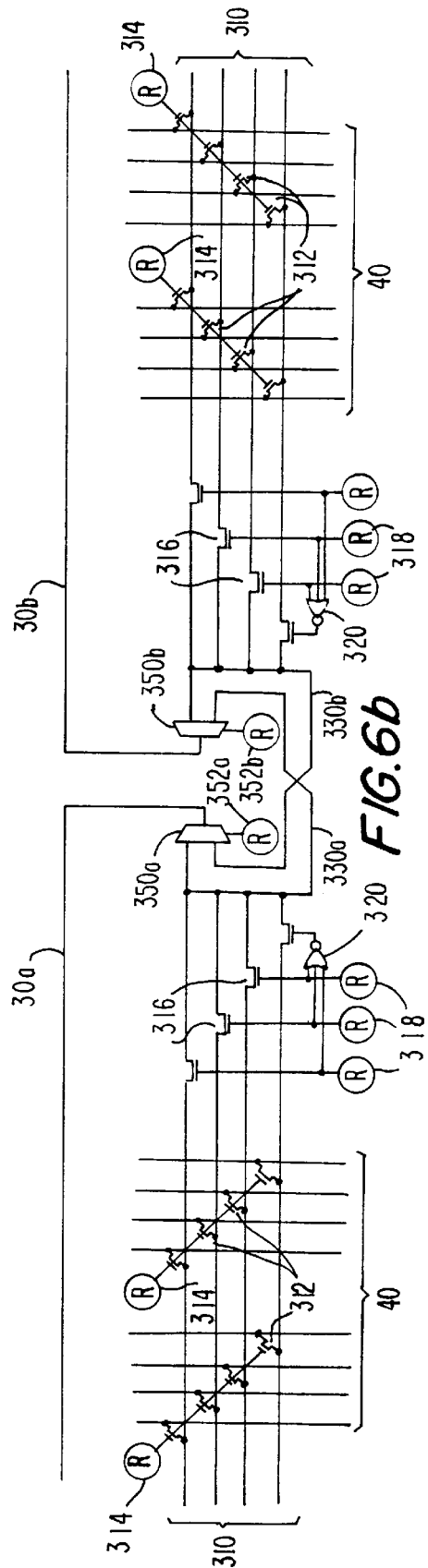

Because relatively large amounts of circuit resources must be devoted to providing the programmable connections (PLCs) between local conductors 40 and logic module input conductors 30, it is desirable to try to reduce the number of PLCs and associated FCEs in these areas of the device. FIGS. 6a and 6b show illustrative ways to accomplish this in accordance with this invention.

As shown in FIG. 6a the conductors 40 between two logic regions 20 are subdivided into two main groups, one to the left of PLCs 350 and one to the right of those PLCs. (It will be understood that only some representative conductors 40 are shown in FIG. 6a, and that there may be more such conductors to the left and right of PLCs 350.) Each of these main groups of conductors 40 is further subdivided into secondary subgroups of substantially equal numbers of conductors 40. In the depicted embodiment, each of these secondary subgroups includes four conductors 40. The subgroups to each side of PLCs 350 are traversed by a respective group of intermediate conductors 310. The number of conductors 310 in each of these groups is equal to the number of conductors 40 in each of the above-mentioned secondary subgroups. Thus in the depicted embodiment there are four conductors 310 to each side of PLCs 350.

Within each secondary subgroup of conductors 40 each conductor is programmably connectable to a respective one of the intermediate conductors 310 that traverse that subgroup. These connections are made by PLCs 312. The PLCs 312 associated with each secondary subgroup of conductors 40 are all controlled in parallel by a common FCE 314. Thus all of the PLCs 312 associated with each secondary subgroup are either enabled or disabled, depending on the programmed state of the associated FCE 314. A further PLC 316 is included in each conductor 310 downstream from PLCs 312. PLCs 316 are controlled by associated FCEs 318, either directly or via an associated NOR gate 320, so that only one of PLCs 316 for each group of conductors 310 is enabled at any time.

The intermediate output signal 330a or 330b thus selected by the PLCs 316 associated with each group of conductors 310 is applied to one input terminal of each of PLCs 350a and 350b. PLCs 350a and 350b are controlled by FCE 352 and inverter 354 to select final output signals 30a and 30b from the two intermediate output signals 330a and 330b. PLCs 350 are wired and their controls are polarized so that when one PLC 350 selects signal 330a as its final output, the other PLC 350 selects signal 330b as its final output signal. Signals 30a and 30b are two logic module inputs such as 30 in FIG. 1. Preferably these two inputs are for logic modules 22 on respective opposite sides of the local conductors 40 served by PLCs 350.

FIG. 6b shows an alternative embodiment in which each PLC 350a and 350b is separately and respectively controlled by its own FCE 352a and 352b. This allows each PLC 350 to select either intermediate output signal 330a or 330b as its final output signal 30.

Constructions of the types shown in FIGS. 6a and 6b considerably reduce the number of FCEs required to control selection of logic module inputs 30 from local conductors 40. If each of two inputs 30 could be selected from any of 16 conductors 40 by independently controlled PLCs between those elements 30 and 40, 32 FCEs would be needed to control the 32 PLCs. The embodiment shown in FIG. 6a achieves a nearly similar result with only 11 FCEs 314, 318, and 352. The embodiment shown in FIG. 6b has greater flexibility than FIG. 6a with the addition of only one more FCE 352.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of this invention, and that various modifications can be made by those skilled in the art without departing from the scope and spirit of the invention. For example, the number of logic modules 22 in each LAB 20 can be varied, as can the numbers of rows and columns of LABs. (The term "logic region" is used herein to refer to either logic modules or LABs.) The numbers of the various types of conductors 40, 50, 60, etc., given as examples above are only illustrative, and other numbers of conductors can be used as desired. The population densities of interconnections in interconnection regions such as 52 and 62 can be changed as desired. The number of inputs and outputs of each logic module 22 can also be changed if desired. It will also be understood that terms like "row" and "column", "horizontal" and "vertical", "top" and "bottom", "left" and "right", and other similar directional or orientational characterizations are entirely arbitrary and are employed only as relative terms for convenience herein. These terms are not intended to have any absolute or fixed meaning or to limit the scope of the claims to any particular device orientations or directions.

The invention claimed is:

1. A programmable logic array integrated circuit device comprising:

a plurality of logic regions disposed on said device in a linear array, each of said logic regions including a plurality of logic modules, each having a plurality of input leads and an output lead and being programmable to perform any one of a plurality of logical operations on input signals applied to said input leads in order to produce an output signal applied to said output lead;

a plurality of inter-region conductors extending along said array;

a plurality of local conductors disposed between each adjacent pair of said logic regions, a first subplurality of said input leads of each of said logic modules being connectable to said local conductors which are adjacent a first side of the logic region which includes that logic module, and a second subplurality of said input leads of each of said logic modules being connectable to said local conductors which are adjacent a second side of the logic region which includes that logic module, signals on said first and second sub-pluralities of input leads of each logic module all being usable in parallel as said input signals on which said logic module is programmable to perform said logical operation;

first programmable logic connectors for selectively making connections between said inter-region conductors and said local conductors;

second programmable logic connectors for selectively making connections between each of said input leads and the local conductors to which that input lead is connectable; and a third programmable logic connector for connecting said output lead of each of said logic modules to a local conductor which is adjacent to one of said sides of the logic region which includes that logic module.

2. The device defined in claim 1 wherein said linear array is one of a plurality of similar linear arrays disposed on said device side by side so that each logic region in a linear array is aligned with a respective one of the logic regions in each other linear array to form a respective column of said logic regions, said columns being substantially perpendicular to said linear arrays.

3. The device defined in claim 2 further comprising:

a plurality of column conductors extending along and adjacent to each of said columns; and fourth programmable logic connectors for selectively making connections between said column conductors and the logic regions in each of said linear arrays that form the column of logic regions adjacent to said column conductors.

4. The device defined in claim 3 wherein said fourth programmable logic connectors are operatively connected between said column conductors and said local conductors that are adjacent to the logic regions that form the column of logic regions adjacent to said column conductors.

5. The device defined in claim 4 wherein said fourth programmable logic connectors are bi-directional.

6. The device defined in claim 1 wherein each of said logic regions has a second output lead in addition to said output lead, said third programmable logic connector associated with each of said logic regions connecting said output lead of said logic region to a local conductor adjacent to said first side of said logic region, and said device further comprising a fourth programmable logic connector for connecting said second output lead of each of said logic regions to a local conductor which is adjacent to a second side of said logic region.

7. The device defined in claim 1 wherein each of said logic regions includes:

combinatorial logic for producing a first signal which is a programmable combination of the input signals applied to said logic region;

a register for registering said first signal to produce a second signal; and an output signal selector for selecting either said first signal or said second signal as said output signal of said logic region.

8. The device defined in claim 7 wherein each of said logic regions further includes:

a register signal selector for selectively substituting one of the input signals applied to said logic region for the first signal of said logic region as the signal registered by the register of said logic region.

9. The device defined in claim 6 wherein each of said logic regions includes:

combinatorial logic for producing a first signal which is a programmable combination of the input signals applied to said logic region;

a register for registering said first signal to produce a second signal;

a first output signal selector for applying either said first signal or said second signal to said output lead of said logic region; and a second output signal selector for applying either said first signal or said second signal to said second output lead of said logic region.

10. The device defined in claim 9 wherein each of said logic regions further includes:

a register signal selector for selectively substituting one of the input signals applied to said logic region for the first signal of said logic region as the signal registered by the register of said logic region.

11. The device defined in claim 1 wherein each of at least a subplurality of the local conductors disposed between each adjacent pair of said logic regions comprises:

a first segment to which selected ones of said first programmable logic connectors but not any of said second programmable logic connectors are connected;

a second segment to which said second programmable logic connectors but not any of said first programmable logic connectors are connected; and interconnection circuitry for selectively connecting said first and second segments of each of said local conductors in said subplurality.

12. The device defined in claim 11 wherein each of said third programmable logic connectors is operatively connected between an associated output lead and one of said second segments.

13. The device defined in claim 11 wherein said interconnection circuitry comprises:

a first tri-state driver for selectively applying a signal on said first segment to said second segment; and a second tri-state driver for selectively-applying a signal on said second segment to said first segment.

14. The device defined in claim 13 wherein said interconnection circuitry comprises:

a programmable function control element for selectively enabling one of said tri-state drivers while tri-stating the other of said tri-state drivers.

15. The device defined in claim 4 wherein each of at least a subplurality of the local conductors disposed between each adjacent pair of said logic regions comprises:

a first segment to which selected ones of said first and fourth programmable logic connectors but not any of said second programmable logic connectors are connected;

a second segment to which said second programmable logic connectors but not any of said first and fourth programmable logic connectors are connected; and interconnection circuitry for selectively connecting said first and second segments of each of said local conductors in said subplurality.

16. The device defined in claim 15 wherein each of said third programmable logic connectors is operatively connected between an associated output lead and one of said second segments.

17. The device defined in claim 15 wherein said interconnection circuitry comprises:
a first tri-state driver for selectively applying a signal on said first segment to said second segment;
a second tri-state driver for selectively applying a signal on said second segment to said first segment; and
a programmable function control element for selectively enabling one of said tri-state drivers while tri-stating the other of said tri-state drivers.

18. The device defined in claim 15 wherein said interconnection circuitry includes an alternate signal connector for selectively connecting a column conductor, which is adjacent to the logic region that said interconnection circuitry is associated with, to said first segment in lieu of said second segment.

19. The device defined in claim 17 wherein said interconnection circuitry further comprises:
an alternate signal connector for selectively connecting a column conductor, which is adjacent to the logic region that said interconnection circuitry is associated with, to said first segment in lieu of said second segment.

20. The device defined in claim 1 wherein said inter-region conductors comprise:
a plurality of first relatively long conductors which extend past a first relatively large number of said logic regions; and
a plurality of second relatively short conductors which extend past a second relatively small number of said logic regions.

21. The device defined in claim 20 wherein said relatively long conductors extend past substantially all of said logic regions.

22. The device defined in claim 21 wherein each of said relatively short conductors extends past approximately half of said logic regions.

23. The device defined in claim 22 wherein said logic regions are divided into two mutually exclusive groups which are linearly spaced from one another in said linear array, each of said groups including a respective half of said logic regions, and wherein approximately half of said relatively short conductors extend along each of said groups.

24. The device defined in claim 20 wherein said inter-region conductors further comprise:
a plurality of third even shorter conductors which extend past a third even smaller number of said logic regions.

25. The device defined in claim 24 wherein said third even smaller number is approximately one quarter of said logic regions.

26. The device defined in claim 23 wherein said inter-region conductors further comprise:
a plurality of third even shorter conductors which extend past a third even smaller number of said logic regions.

27. The device defined in claim 26 wherein said third even smaller number is approximately one quarter of said logic regions, and wherein each quarter of said third even shorter conductors extends along a respective quarter of said logic regions, said quarters of said logic regions being spaced along said linear array.

28. The device defined in claim 24 wherein said inter-region conductors further comprise:
a plurality of fourth still shorter conductors which extend past a fourth still smaller number of said logic regions.

29. The device defined in claim 28 wherein said fourth still smaller number of said logic regions is approximately one eighth of said logic regions.

30. The device defined in claim 27 wherein said inter-region conductors further comprise:
a plurality of fourth still shorter conductors which extend past a fourth still smaller number of said logic regions.

31. The device defined in claim 30 wherein said fourth still smaller number is approximately one eighth of said logic regions, and wherein each eighth of said fourth still shorter conductors extends along a respective eighth of said logic regions, said eighths of said logic regions being spaced along said linear array.

32. The device defined in claim 1 further comprising:
an output terminal adjacent an end of said linear array, one of said pluralities of local conductors being disposed between said output terminal and the one of said logic regions which is adjacent said end of said linear array;
an output terminal feeding conductor traversing said local conductors between said output terminal and said logic region which is adjacent said end of said linear array; and
fourth programmable logic connectors for selectively making connections between said output feeding conductor and said local conductors traversed by said output feeding conductor.

33. The device defined in claim 32 wherein said output terminal feeding conductor includes an output terminal driver which requires an output enable signal applied to an output enable terminal of said driver in order to drive said output terminal with the signal on said output terminal feeding conductor, and wherein said device further comprises:
an output enable conductor connected to said output enable terminal and traversing said local conductors between said output terminal and said logic region which is adjacent said end of said linear array; and
fifth programmable logic connectors for selectively making connections between said output enable conductor and said local conductors traversed by said output feeding conductor.

34. The device defined in claim 1 further comprising:
an input terminal adjacent an end of said linear array, one of said pluralities of local conductors being disposed between said input terminal and the one of said logic regions which is adjacent said end of said linear array; and
a fourth programmable logic connector for selectively connecting said input terminal to one of said local conductors that are disposed between said input terminal and the one of said logic regions which is adjacent said end of said linear array.

35. The device defined in claim 1 further comprising:
an output terminal adjacent a side of said linear array;
an output terminal feeding conductor traversing one of said pluralities of local conductors; and
fourth programmable logic connectors for selectively making connections between said output feeding conductor and said local conductors traversed by said output feeding conductors.

36. The device defined in claim 35 wherein said output terminal feeding conductor includes an output terminal driver which requires an output enable signal applied to an output enable terminal of said driver in order to drive said output terminal with the signal on said output terminal feeding conductor, and wherein said device further comprises:
an output enable conductor connected to said output terminal and traversing said local conductors that are traversed by said output terminal feeding conductor; and fifth programmable logic connectors for selectively making connections between said output enable conductor and said local conductors traversed by said output enable conductor.

37. The device defined in claim 1 further comprising:

an input terminal adjacent a side of said linear array; and a fourth programmable logic connector for selectively connecting said input terminal to one of said local conductors.

38. A programmable logic array integrated circuit device comprising:

a plurality of regions of programmable logic, each of which includes a plurality of modules of programmable logic, each module having a plurality of inputs and an output and being programmable to produce as said output any of a plurality of logic functions of the inputs of that module;

a plurality of inter-region conductors adjacent to each of said regions, the inter-region conductors adjacent to each region including three subpluralities of said inter-region conductors, the conductors in a first of said subpluralities extending adjacent to a first relatively large number of said regions, the conductors in a second of said subpluralities extending adjacent to a second relatively small number of said regions, and the conductors in a third of said subpluralities extending adjacent to a third number of said regions which is even smaller than said second number;

a plurality of local conductors associated with each of said regions;

first programmable logic connectors for selectively connecting inter-region conductors adjacent to each region with local conductors associated with that region;

second programmable logic connectors for selectively connecting local conductors associated with each region to the inputs of the modules of that region; and third programmable logic connectors for selectively connecting the outputs of the modules of each region to inter-region conductors adjacent to said region.

39. The device defined in claim 38 wherein the number of said inter-region conductors in said second subplurality is less than the number of said inter-region conductors in said first subplurality but more than the number of said inter-region conductors in said third subplurality.

40. The device defined in claim 38 wherein said third programmable logic connectors for the outputs of the modules of each region selectively connect said outputs to local conductors associated with that region.

41. A programmable logic array integrated circuit device comprising:

a plurality of regions of programmable logic disposed on said device in a two-dimensional array of intersecting rows and columns of said regions, each of said regions including a plurality of modules of programmable logic, each having a plurality of inputs adjacent a side of the region which includes that module and an output and being programmable to produce as said output any one of a plurality of logic functions of said inputs, all of said inputs of each of said modules being usable in parallel as logical inputs to the logic function performed by that module to produce said output of that module;

a plurality of row conductors adjacent to each of said rows for conveying signals along said row;

a plurality of column conductors adjacent to each of said columns for conveying signals along said column;

a plurality of local conductors associated with each of said regions, the local conductors associated with each of said regions being disposed adjacent said side of that region;

first programmable logic connectors for selectively connecting row conductors adjacent to each region with local conductors associated with that region;

second programmable logic connectors for selectively connecting column conductors adjacent to each region with local conductors associated with that region;

third programmable logic connectors for selectively connecting local conductors associated with each region to the inputs of the modules of that region; and fourth programmable logic connectors for selectively connecting the output of each module of each region to at least one conductor adjacent to that region, wherein a local conductor associated with each of said regions includes:

a first segment to which said first and second programmable logic connectors are connected;

a second segment to which said third and fourth programmable logic connectors are connected; and a fifth programmable logic connector for selectively connecting said first and second segments to one another.

42. A programmable logic array integrated circuit device comprising:

a plurality of regions of programmable logic, each of said regions being programmable to produce a first output signal which is any of a plurality of logic functions of a plurality of region input signals applied to that region, each of said regions including a register for registering a signal applied to the register and producing a second output signal indicative of the signal registered by the register, and each of said regions further including a first programmable logic connector for selectively applying either said first output signal or a region input signal to the register;

a plurality of first conductors extending adjacent to said regions for conveying signals between the regions; and a plurality of second conductors associated with each of said regions for (1) selectively conveying signals to the associated region for use as region input signals of the associated region, and (2) conveying output signals from the associated region, at least some of said second conductors being connectable to said first conductors, wherein each of said regions further includes second and third programmable logic connectors, both of which are uniquely associated with said register of said region and with no other register on said device, and each of which can apply a signal indicative of either of said first and second output signals to a respective one of said second conductors.

43. A programmable logic array integrated circuit device comprising:

a plurality of regions of programmable logic disposed on said device in a two-dimensional array of intersecting rows and columns of said regions, each of said regions including a plurality of modules of programmable logic disposed in a linear array in that region, each module having a plurality of inputs and an output and being programmable to produce as said output any one of a plurality of logic functions of said inputs;

a plurality of row conductors adjacent to each of said rows for conveying signals along said row;

a plurality of column conductors adjacent to each of said columns for conveying signals along said column;

a plurality of local conductors associated with each of said regions and extending along the linear array of modules in that region;

first programmable logic connectors for selectively connecting row conductors adjacent to each region with local conductors associated with that region;

second programmable logic connectors for selectively connecting column conductors adjacent to each region with local conductors associated with that region;

third programmable logic connectors for selectively connecting local conductors associated with each region to the inputs of the modules of that region; and fourth programmable logic connectors for selectively connecting the output of each module of each region to at least one conductor adjacent to that region, wherein a local conductor associated with each of said regions includes:

a first segment to which at least one of said first and at least one of said second programmable logic connectors are connected;

a second segment to which at least one of said third and at least one of said fourth programmable logic connectors are connected; and a fifth programmable logic connector for selectively connecting said first and second segments to one another.

* * * * *